United States Patent
Fujisawa (10) Patent No.: US 8,581,598 B2
(45) Date of Patent: Nov. 12, 2013

(54) METHOD FOR INSPECTING ELECTROSTATIC CHUCK, AND ELECTROSTATIC CHUCK APPARATUS

(75) Inventor: Hiroshi Fujisawa, Nara (JP)

(73) Assignee: Creative Technology Corporation, Tokyo (JP)

( * ) Notice: Subject to any disclaimer, the term of this patent is extended or adjusted under 35 U.S.C. 154(b) by 282 days.

(21) Appl. No.: 13/124,988

(22) PCT Filed: Oct. 19, 2009

(86) PCT No.: PCT/JP2009/068014
§ 371 (c)(1),
(2), (4) Date: Apr. 19, 2011

(87) PCT Pub. No.: WO2010/047311
PCT Pub. Date: Apr. 29, 2010

(65) Prior Publication Data
US 2011/0199093 A1 Aug. 18, 2011

(30) Foreign Application Priority Data

Oct. 20, 2008 (JP) ................................ 2008-269288

(51) Int. Cl.
*G01R 31/02* (2006.01)
(52) U.S. Cl.
USPC ........................................................ 324/537
(58) Field of Classification Search
None
See application file for complete search history.

(56) References Cited

U.S. PATENT DOCUMENTS

| | | | | |
|---|---|---|---|---|
| 6,788,506 | B1 * | 9/2004 | Stockstad | 361/56 |
| 7,471,494 | B2 * | 12/2008 | Ausserlechner | 361/90 |
| 2004/0114124 | A1 | 6/2004 | Hoeks et al. | |

FOREIGN PATENT DOCUMENTS

| | | |
|---|---|---|
| JP | 11-330220 A | 11/1999 |
| JP | 2002-305237 A | 10/2002 |
| JP | 2004-104114 A | 4/2004 |
| JP | 2008-47564 A | 2/2008 |

OTHER PUBLICATIONS

International Preliminary Report on Patentability issued on Apr. 26, 2011, including Forms PCT/IB/373, PCT/IB/326 and PCT/ISA/237 in Intl. Application No. PCT/JP2009/068014 and English translations of the Written Opinion and the International Preliminary Report on Patentability.
International Search Report dated Dec. 28, 2009 for PCT/JP2009/068014.

* cited by examiner

*Primary Examiner* — Jermele M Hollington
*Assistant Examiner* — Trung Nguyen
(74) *Attorney, Agent, or Firm* — Birch, Stewart, Kolasch & Birch, LLP (57) ABSTRACT

Provided are a method and an apparatus capable of determining which attracting electrode in an electrostatic chuck of bipolar type has a capacitance abnormality occurring in its vicinity. In this inspection method, a positive auxiliary electrode (12) and a negative auxiliary electrode (14) are provided in a dielectric body (6) of an electrostatic chuck (4), and are connected to a ground potential portion. Then, transient currents ($I_1$ to $I_4$) flowing through the attracting electrodes (8 and 10) and the auxiliary electrodes (12 and 14) are measured when direct current voltages (+V and −V) are applied or cease to be applied from a chuck power supply (26) to the electrostatic chuck (4) under a state in which an object (2) to be attracted is not mounted, and a transient current ($I_5$) ($=I_1-I_2$ or $I_3-I_4$) is calculated. The obtained transient currents are compared to respective predetermined reference values, to thereby determine a capacitance abnormality in the electrostatic chuck (4).

6 Claims, 5 Drawing Sheets

METHOD FOR INSPECTING ELECTROSTATIC CHUCK, AND ELECTROSTATIC CHUCK APPARATUS

TECHNICAL FIELD

The present invention relates to a method of inspecting an electrostatic chuck, which is performed in an electrostatic chuck apparatus including an electrostatic chuck of bipolar type including, in a dielectric body, two attracting electrodes, and a chuck power supply for supplying direct current voltages for attraction to the two attracting electrodes. The present invention also relates to an electrostatic chuck apparatus.

BACKGROUND ART

It is a conventional practice to perform an inspection for an abnormality in an electrostatic chuck, for example, after such an electrostatic chuck of bipolar type as described above is manufactured, or after the electrostatic chuck is incorporated into an apparatus which uses the electrostatic chuck, such as a semiconductor manufacturing apparatus.

As a method of performing an inspection for an abnormality in an electrostatic chuck, for example, the following method has been conventionally used. That is, by using two ammeters provided between the two attracting electrodes of the electrostatic chuck and the chuck power supply, there are measured leakage currents [steady-state currents after the power supply is turned on (that is, currents which have converged to a constant value)] flowing through both the attracting electrodes under a state in which an object to be attracted such as a substrate is not mounted.

Note that, Patent Literature 1 does not describe a method of performing an inspection for an abnormality in an electrostatic chuck, but describes an example of two ammeters similar to those in the above and current waveforms flowing therethrough. The above-mentioned leakage current corresponds to the steady-state current of the current obtained when a substrate is not placed, which is shown in FIG. 3 of Patent Literature 1.

However, with the conventional inspection method described in Patent Literature 1, it is possible to recognize whether or not there is an insulation failure in galvanic terms, but it is impossible to determine a capacitance abnormality in the electrostatic chuck. Considering that the electrostatic chuck attracts an object to be attracted by means of static electricity, the capacitance abnormality in the electrostatic chuck causes an abnormality in attracting force with respect to the object to be attracted. Further, the capacitance abnormality also causes an adverse effect on a determination of whether or not an object to be attracted exists on the electrostatic chuck, or a determination of whether or not an object to be attracted has been attracted normally. Hence, it is important to detect a capacitance abnormality, instead of an insulation failure in galvanic terms.

In addition, with the inspection method of Patent Literature 1, based on the magnitude of the leakage current, it can be recognized that there is an insulation failure somewhere in the electrostatic chuck, but it is impossible to determine which attracting electrode has an abnormality in its vicinity. For example, it is impossible to determine which one of two attracting electrodes has an abnormality in its vicinity, or to determine whether or not there is an abnormality between the pair of the attracting electrodes. If there is a difference between the measured values of the two ammeters, it may be possible to assume which attracting electrode is closer to the portion of abnormality, but there is no guarantee that the assumption is correct.

Further, apart from Patent Literature 1 described above, there is proposed the following method as a method used in a mounting base for a glass substrate, which includes an electrostatic chuck including chuck electrodes between a lower dielectric body layer and an upper dielectric body layer, and lower electrodes disposed below the electrostatic chuck. In order to diagnose an insulated state of the dielectric body layers before the electrostatic chuck starts to be used, the method includes applying, to the chuck electrode of the electrostatic chuck, a direct current diagnosis voltage which is lower compared to a case where the glass substrate is attracted and held, measuring electric properties (voltage and current) of the electrostatic chuck at this time, and determining whether or not the electrostatic chuck can be used based on the obtained measurement data and preset setting data (Patent Literature 2).

However, similarly to the case of Patent Literature 1, by comparing the measurement data and the setting data, the diagnosis method for the electrostatic chuck described in Patent Literature 2, too, enables determining whether or not there is an insulation failure somewhere in the electrostatic chuck, but it is impossible to determine which attracting electrode has an abnormality in its vicinity.

CITATION LIST

Patent Literature

Patent Literature 1: JP 11-330220 A (FIG. 1 and FIG. 3)
Patent Literature 2: JP 2008-047564 A (FIG. 1 and FIG. 2)

SUMMARY OF INVENTION

Technical Problem

By the way, the electrostatic chuck attracts an object to be attracted by means of static electricity, and hence a capacitance abnormality in the electrostatic chuck causes an abnormality in attracting force with respect to the object to be attracted. Particularly, in an electrostatic chuck of bipolar type for attracting by means of static electricity an object to be attracted, which includes, in a dielectric body, a positive attracting electrode and a negative attracting electrode arranged along a surface of the dielectric body, it is vitally important to determine which one of the two attracting electrodes has an abnormality in its vicinity, or whether there is an abnormality between the pair of the attracting electrodes because such determination serves to guarantee normal attraction and locate a failed portion at the time of manufacture and actual operation, and also because it becomes possible to easily determine which electrode has a problem such as breakage, missing of an electrode, or short circuit to a ground. In view of the above, the present invention has a main object to provide a method and an apparatus, which are capable of determining which attracting electrode in an electrostatic chuck of bipolar type has a capacitance abnormality occurring in its vicinity.

Solution to Problem

According to the present invention, there is provided a method of inspecting an electrostatic chuck, which is used in an electrostatic chuck apparatus including: an electrostatic chuck of bipolar type for attracting an object to be attracted by means of static electricity, including, in a dielectric body, a positive attracting electrode and a negative attracting electrode arranged along a surface of the dielectric body; a chuck power supply for supplying, with a ground potential portion set as a reference, a positive direct current voltage and a negative direct current voltage to the positive attracting electrode and the negative attracting electrode of the electrostatic chuck, respectively; and a positive auxiliary electrode and a negative auxiliary electrode on a back surface side of the positive attracting electrode and the negative attracting electrode in the dielectric body of the electrostatic chuck, the positive auxiliary electrode and the negative auxiliary electrode being arranged so as to face the positive attracting electrode and the negative attracting electrode, respectively, with a predetermined gap therebetween, and being connected to the ground potential portion, the method of inspecting an electrostatic chuck including a determination step of: measuring each of at least three of transient currents obtained when, under a state in which the object to be attracted is not mounted on the electrostatic chuck, the positive direct current voltage and the negative direct current voltage are applied to the electrostatic chuck from the chuck power supply or cease to be applied to the electrostatic chuck from the chuck power supply, the transient currents including: (a) a first transient current flowing between the positive attracting electrode of the electrostatic chuck and the chuck power supply; (b) a second transient current flowing between the positive auxiliary electrode of the electrostatic chuck and the ground potential portion; (c) a third transient current flowing between the negative attracting electrode of the electrostatic chuck and the chuck power supply; and (d) a fourth transient current flowing between the negative auxiliary electrode of the electrostatic chuck and the ground potential portion; calculating a fifth transient current representing a difference between the first transient current and the second transient current or a difference between the third transient current and the fourth transient current; comparing obtained transient currents to respective reference values of transient currents obtained from a normal electrostatic chuck; and determining a capacitance abnormality in a vicinity of each of the positive attracting electrode and the negative attracting electrode of the electrostatic chuck.

According to the present invention, there is provided an electrostatic chuck apparatus including: an electrostatic chuck of bipolar type for attracting an object to be attracted by means of static electricity, including, in a dielectric body, a positive attracting electrode and a negative attracting electrode arranged along a surface of the dielectric body; a chuck power supply for supplying, with a ground potential portion set as a reference, a positive direct current voltage and a negative direct current voltage to the positive attracting electrode and the negative attracting electrode of the electrostatic chuck, respectively; a positive auxiliary electrode and a negative auxiliary electrode on a back surface side of the positive attracting electrode and the negative attracting electrode in the dielectric body of the electrostatic chuck, the positive auxiliary electrode and the negative auxiliary electrode being arranged so as to face the positive attracting electrode and the negative attracting electrode, respectively, with a predetermined gap therebetween; a first ammeter connected between the positive attracting electrode of the electrostatic chuck and the chuck power supply, for measuring a first transient current flowing therebetween; a second ammeter connected between the positive auxiliary electrode of the electrostatic chuck and the ground potential portion, for measuring a second transient current flowing therebetween; a third ammeter connected between the negative attracting electrode of the electrostatic chuck and the chuck power supply, for measuring a third transient current flowing therebetween; a fourth ammeter connected between the negative auxiliary electrode of the electrostatic chuck and the ground potential portion, for measuring a fourth transient current flowing therebetween; operation means for calculating a fifth transient current determined as a difference between the first transient current and the second transient current or as a difference between the third transient current and the fourth transient current; and a determination apparatus including a function of: measuring at least three of the first transient current, the second transient current, the third transient current, and the fourth transient current, which are measured by at least three of the first ammeter, the second ammeter, the third ammeter, and the fourth ammeter when, under a state in which the object to be attracted is not mounted on the electrostatic chuck, the positive direct current voltage and the negative direct current voltage are applied to the electrostatic chuck from the chuck power supply or cease to be applied to the electrostatic chuck from the chuck power supply; calculating the fifth transient current, which is calculated by the operation means; comparing obtained transient currents to respective reference values of transient currents obtained from a normal electrostatic chuck; and determining a capacitance abnormality in the electrostatic chuck.

The first transient current and the second transient current correspond to the magnitude of the capacitance between the positive attracting electrode and the positive auxiliary electrode of the electrostatic chuck. The third transient current and the fourth transient current correspond to the magnitude of the capacitance between the negative attracting electrode and the negative auxiliary electrode of the electrostatic chuck. The fifth transient current corresponds to the magnitude of the capacitance between the positive attracting electrode and the negative attracting electrode of the electrostatic chuck.

Accordingly, in the determination of which attracting electrode in the electrostatic chuck of bipolar type has a capacitance abnormality occurring in its vicinity, it is possible to determine whether or not there is a capacitance abnormality by measuring at least three of the first transient current, the second transient current, the third transient current, and the fourth transient current, and comparing the first transient current or the second transient current, the third transient current or the fourth transient current, and the fifth transient current determined as the difference between the first transient current and the second transient current or as the difference between the third transient current and the fourth transient current, to the respective predetermined reference values (the corresponding first transient current, second transient current, third transient current, fourth transient current, and fifth transient current obtained from the normal electrostatic chuck having the same specifications as the electrostatic chuck). In addition to the determination of which attracting electrode in the electrostatic chuck of bipolar type has a capacitance abnormality occurring in its vicinity, it is also possible to determine whether or not there is a capacitance abnormality occurring between the pair of the attracting electrodes.

Further, in the present invention, whether or not there is a capacitance abnormality in the electrostatic chuck of bipolar type is determined by using the measured or calculated first transient current, second transient current, third transient current, fourth transient current, and fifth transient current. Therefore, compared to the conventional case of using voltages and currents, the present invention has an advantage of being able to obtain many pieces of information regarding the capacitance, which is the basis for the electrostatic chuck to exert its function.

Further, in the present invention, the determination step (determination apparatus) preferably includes, when the positive direct current voltage and the negative direct current voltage are applied to the electrostatic chuck from the chuck power supply: (a) a first step (first function) of measuring at least one of the first transient current and the second transient current, comparing a time period taken for the at least one of the first transient current and the second transient current to be decreased to a predetermined proportion to a peak value thereof to a corresponding time period of the normal electrostatic chuck, and determining a capacitance abnormality between the positive attracting electrode and the positive auxiliary electrode of the electrostatic chuck; (b) a second step (second function) of measuring at least one of the third transient current and the fourth transient current, comparing a time period taken for the at least one of the third transient current and the fourth transient current to be decreased to the predetermined proportion to a peak value thereof to a corresponding time period of the normal electrostatic chuck, and determining a capacitance abnormality between the negative attracting electrode and the negative auxiliary electrode of the electrostatic chuck; and (c) a third step (third function) of comparing a peak value of the fifth transient current determined as the difference between the first transient current and the second transient current or as the difference between the third transient current and the fourth transient current, to a corresponding peak value of the normal electrostatic chuck, and determining a capacitance abnormality between the positive attracting electrode and the negative attracting electrode of the electrostatic chuck. In this way, whether or not there is a capacitance abnormality is determined by using the time periods taken for the peak values of the measured transient currents to be decreased to the predetermined proportions to the peak values, and hence the present invention has an advantage that a more accurate determination can be made because of less influences from impedances of wires between the power supply and the electrostatic chuck and from electromagnetic field disturbances in the environment.

Still further, in the present invention, the positive auxiliary electrode of the electrostatic chuck preferably has a shape corresponding to the positive attracting electrode, and the negative auxiliary electrode preferably has a shape corresponding to the negative attracting electrode. With this, the capacitances between the attracting electrodes and the auxiliary electrodes become larger, and accordingly, the transient currents flowing through the capacitances also become larger and change more gradually. As a result, changes in the transient currents can be determined with more ease, resulting in easier determination of abnormalities in the capacitances.

Advantageous Effects of Invention

According to the present invention, at least three of the first transient current, the second transient current, the third transient current, and the fourth transient current are measured, and the fifth transient current is determined. Then, the transient currents are compared to the respective predetermined reference values to thereby determine a capacitance abnormality. By doing so, it is possible to determine which attracting electrode in the electrostatic chuck of bipolar type has a capacitance abnormality occurring in its vicinity, and it is also possible to determine that a capacitance abnormality has occurred between the pair of the attracting electrodes.

DESCRIPTION OF EMBODIMENT

Hereinbelow, based on an embodiment illustrated in the attached drawings, the present invention is described in detail.

Note that, in the following embodiment, description is given of a case where an electrostatic chuck is inspected by using a transient current obtained when positive and negative direct current voltages are applied to the electrostatic chuck from a chuck power supply, but the present invention is also applicable to a case where the electrostatic chuck is inspected by using a transient current obtained when the positive and negative direct current voltages cease to be applied to the electrostatic chuck from the chuck power supply.

Figure 1:
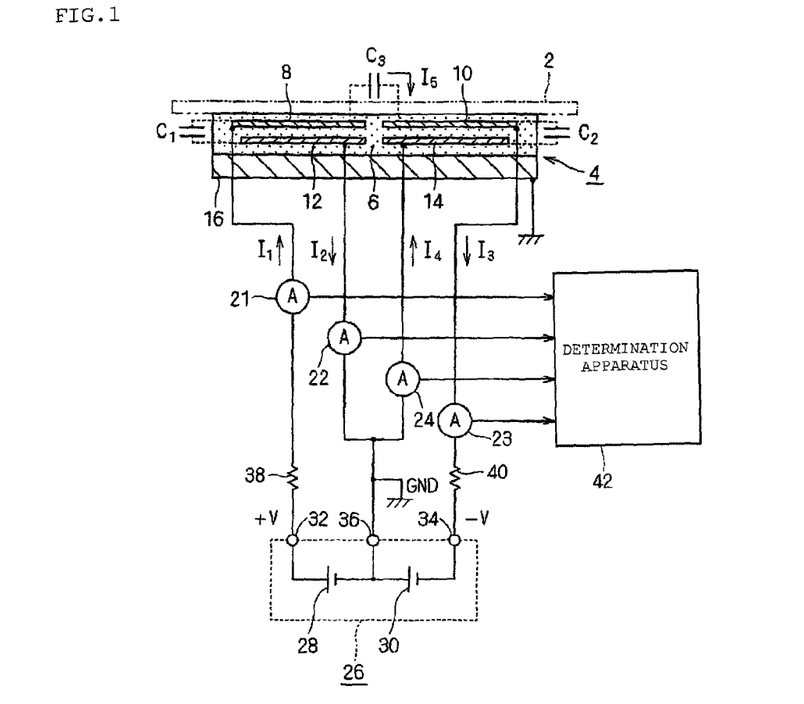
FIG. 1 is a diagram illustrating an embodiment of an electrostatic chuck apparatus which performs an inspection method according to the present invention.
Figure 2:
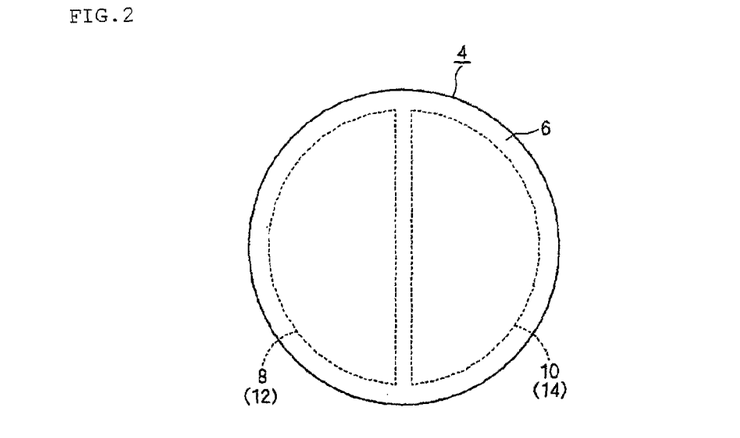
FIG. 2 is a schematic plan view of an electrostatic chuck of FIG. 1.

FIG. 1 is a diagram illustrating an embodiment of an electrostatic chuck apparatus which performs an inspection method according to the present invention. FIG. 2 is a schematic plan view of an electrostatic chuck of FIG. 1.

The electrostatic chuck apparatus includes: an electrostatic chuck 4 of bipolar type for attracting an object 2 to be attracted (for example, a substrate such as a wafer) by means of static electricity; and a chuck power supply 26 for supplying, with a ground potential portion GND set as a reference, a positive direct current voltage +V and a negative direct current voltage −V to a positive attracting electrode 8 and a negative attracting electrode 10 of the electrostatic chuck 4, respectively.

Near an inside surface of a dielectric body 6 made of, for example, a ceramic, the electrostatic chuck 4 has the pair of the positive attracting electrode 8 and the negative attracting electrode 10 arranged along the surface. In this embodiment, the pair of the attracting electrodes 8 and 10 both have a semicircular shape as in the example illustrated in FIG. 2, and are arranged facing each other on the same plane so as to form a circle. Note that, the shapes of the pair of the attracting electrodes 8 and 10 are not limited thereto, and other shapes such as a comb shape may be employed.

On a back surface side of the positive attracting electrode 8 and the negative attracting electrode 10 inside the dielectric body 6 of the electrostatic chuck 4 (in other words, opposite side to a surface for attracting the object 2 to be attracted), there are arranged a positive auxiliary electrode 12 and a negative auxiliary electrode 14 so as to face the pair of the attracting electrodes 8 and 10, respectively, with a gap therebetween. The pair of the auxiliary electrodes 12 and 14 do not need to have a shape which corresponds to those of the attracting electrodes 8 and 10. However, in this embodiment, the positive auxiliary electrode 12 has a shape which corresponds to that of the positive attracting electrode 8, while the negative auxiliary electrode 14 has a shape which corresponds to that of the negative attracting electrode 10. More specifically, in this embodiment, the pair of the auxiliary electrodes 12 and 14 both have a semicircular shape having substantially the same dimensions as those of the attracting electrodes 8 and 10, respectively, and are arranged facing each other on the same plane so as to form a circle.

Note that, in FIG. 1, the auxiliary electrodes 12 and 14 are illustrated smaller than the attracting electrodes 8 and 10, but this arrangement is made merely for the convenience of illustration. In FIG. 2, the auxiliary electrodes 12 and 14 are not illustrated in the figure because of the overlapping with the attracting electrodes 8 and 10.

Under a state in which the object 2 to be attracted is not mounted, a first capacitance $C_1$ is formed between the positive attracting electrode 8 and the positive auxiliary electrode 12, a second capacitance $C_2$ is formed between the negative attracting electrode 10 and the negative auxiliary electrode 14, and a third capacitance $C_3$ is formed between the positive attracting electrode 8 and the negative attracting electrode 10. Those capacitances are illustrated in FIG. 1 in the form of an equivalent circuit.

In this embodiment, the electrostatic chuck 4 includes a support board 16 for supporting the dielectric body 6 and the like. In a case where the support board 16 is made of a conductor such as a metal, the support board 16 is usually grounded electrically.

The chuck power supply 26 includes a positive power supply 28 for outputting, as a ground terminal 36 set as a reference, the positive direct current voltage +V from a positive output terminal 32, and a negative power supply 30 for outputting, as the ground terminal 36 set as the reference, the negative direct current voltage −V from a negative output terminal 34. The direct current voltages +V and −V are equal in magnitude, and have opposite polarities.

Between the positive attracting electrode 8 of the electrostatic chuck 4 and the chuck power supply 26 (more specifically, positive output terminal 32 thereof), there is connected a first ammeter 21 for measuring a first transient current $I_1$ flowing therebetween. A current limiting resistor 38 is connected in series as needed along a line of the ammeter 21.

Between the positive auxiliary electrode 12 of the electrostatic chuck 4 and the ground potential portion GND, there is connected a second ammeter 22 for measuring a second transient current $I_2$ flowing therebetween. In other words, the positive auxiliary electrode 12 is connected to the ground potential portion GND (that is, grounded) via the ammeter 22. Further, the ground terminal 36 of the chuck power supply 26 is also connected to the ground potential portion GND, and hence it can be said that the positive auxiliary electrode 12 is connected to the ground terminal 36 of the chuck power supply 26 via the ammeter 22.

Between the negative attracting electrode 10 of the electrostatic chuck 4 and the chuck power supply 26 (more specifically, negative output terminal 34 thereof), there is connected a third ammeter 23 for measuring a third transient current $I_3$ flowing therebetween. A current limiting resistor 40, which has the same resistance value as that of the current limiting resistor 38, is connected in series as needed along a line of the ammeter 23.

Between the negative auxiliary electrode 14 of the electrostatic chuck 4 and the ground potential portion GND, there is connected a fourth ammeter 24 for measuring a fourth transient current $I_4$ flowing therebetween. In other words, the negative auxiliary electrode 14 is connected to the ground potential portion GND (that is, grounded) via the ammeter 24. Alternatively, it can be said that the negative auxiliary electrode 14 is connected to the ground terminal 36 of the chuck power supply 26 via the ammeter 24.

The chuck power supply 26 is a direct current power supply, and hence the transient currents $I_1$ to $I_4$ are, in essence, such currents that flow transiently when the chuck power supply 26 is turned on, that is, when the positive and negative direct current voltages +V and −V are applied to the electrostatic chuck 4 from the chuck power supply 26. This is described later in detail with reference to FIG. 3 and the subsequent figures.

Further, when the chuck power supply 26 is turned on, a transient current $I_5$ flows through the capacitance $C_3$. According to Kirchhoff's law, the transient current $I_5$ is a current representing a difference between the transient currents $I_1$ and $I_2$, or a difference between the transient currents $I_3$ and $I_4$. Specifically, the transient current $I_5$ can be determined by Equation 1 or Equation 2 as follows.

$$I_5 = I_1 - I_2 \qquad \text{[Equation 1]}$$

$$I_5 = I_3 - I_4 \qquad \text{[Equation 2]}$$

Pieces of data on the transient currents $I_1$ to $I_4$ respectively measured by the ammeters 21 to 24 are supplied to a determination apparatus 42. In this embodiment, the determination apparatus 42 includes, in addition to functions described later, operation means for calculating the transient current $I_5$ according to the above Equation 1 or Equation 2. The determination apparatus 42 is configured by using, for example, a computer.

In order to inspect the electrostatic chuck 4, in the inspection method according to this embodiment, the following determination step is performed.

That is, of the transient currents $I_1$ to $I_5$ obtained when the positive and negative direct current voltages +V and −V are applied to the electrostatic chuck 4 from the chuck power supply 26 under the state in which the object 2 to be attracted is not mounted on the electrostatic chuck 4, at least four transient currents including the transient current $I_5$ are respectively measured. Specifically, the at least four transient currents of a combination shown in Table 1 are respectively measured. All the five transient currents $I_1$ to $I_5$ may be measured and calculated. Then, the transient currents obtained through the measurement and calculation are compared to a predetermined reference value, respectively, to thereby determine a capacitance abnormality in the electrostatic chuck 4.

TABLE 1

| Combination | For determination of $C_1$ | For determination of $C_2$ | For determination of $C_3$ | For calculation of $I_5$ |
|---|---|---|---|---|
| 1 | $I_1$ | $I_3$ | $I_5$ | $I_2$ |
| 2 | $I_1$ | $I_3$ | $I_5$ | $I_4$ |
| 3 | $I_1$ | $I_4$ | $I_5$ | $I_2$ |
| 4 | $I_1$ | $I_4$ | $I_5$ | $I_3$ |
| 5 | $I_2$ | $I_3$ | $I_5$ | $I_1$ |
| 6 | $I_2$ | $I_3$ | $I_5$ | $I_4$ |
| 7 | $I_2$ | $I_4$ | $I_5$ | $I_1$ |
| 8 | $I_2$ | $I_4$ | $I_5$ | $I_3$ |

The transient current for calculation of $I_5$ of Table 1 is such a transient current that is necessary for calculating the transient current $I_5$ according to the above Equation 1 or Equation 2, apart from the transient currents for determination of the capacitances $C_1$, $C_2$, and $C_3$.

The transient currents $I_1$ and $I_2$ correspond to the magnitude of the capacitance $C_1$. The transient currents $I_3$ and $I_4$ correspond to the magnitude of the capacitance $C_2$. The transient current $I_5$ corresponds to the magnitude of the capacitance $C_3$. Accordingly, by performing the above-mentioned determination step, it is possible to determine which one of the attracting electrodes 8 and 10 in the electrostatic chuck 4 has an abnormality in capacitance ($C_1$ or $C_2$) in its vicinity, and it is also possible to determine that an abnormality has occurred in the capacitance $C_3$ between the pair of the attracting electrodes 8 and 10.

That is, according to this inspection method, owing to the provision of the auxiliary electrodes 12 and 14 corresponding to the pair of the attracting electrodes 8 and 10, respectively, the transient currents $I_2$ and $I_4$, which are respectively return currents from the pair of the auxiliary electrodes 12 and 14, can be measured, and also, the transient current $I_5$ flowing between the pair of the attracting electrodes 8 and 10 can be calculated according to the above Equation 1 or Equation 2. Therefore, it is possible to recognize changes in capacitances $C_1$ to $C_3$ with more ease.

Further description of the above is given below along with a more specific example of the determination step. In the embodiment given below, the determination step includes the following first to third steps.

(a) The first step includes measuring at least one of the transient currents $I_1$ and $I_2$, comparing a time period taken for the at least one of the transient currents to be decreased to a predetermined proportion to a peak value thereof to a corresponding time period of a normal electrostatic chuck having the same specifications as the electrostatic chuck 4, and determining an abnormality in the capacitance $C_1$ between the positive attracting electrode 8 and the positive auxiliary electrode 12 of the electrostatic chuck 4.

The predetermined proportion to the peak value is, for example, 1/e of the peak value. The symbol e represents the base of the natural logarithm, and thus is 2.718. The predetermined proportion is not limited thereto, but the following description is given by taking this proportion as an example. The same applies to a predetermined proportion used in the following second step.

Further, in the determination of the capacitance $C_1$, both the transient currents $I_1$ and $I_2$ may be measured and used for the determination. This increases the accuracy of the determination. The same applies to the transient currents $I_3$ and $I_4$ used in the subsequent second step. However, in the following simulation, description is given by taking as an example a case where the transient current $I_1$ is used for the determination of the capacitance $C_1$, and the transient current $I_3$ is used for the determination of the capacitance $C_2$.

(b) The second step includes measuring at least one of the transient currents $I_3$ and $I_4$, comparing a time period taken for the at least one of the transient currents to be decreased to the predetermined proportion to a peak value thereof to a corresponding time period of the normal electrostatic chuck having the same specifications as the electrostatic chuck 4, and determining an abnormality in the capacitance $C_2$ between the negative attracting electrode 10 and the negative auxiliary electrode 14 of the electrostatic chuck 4.

(c) The third step includes calculating the transient current $I_5$, comparing a peak value of the transient current to a corresponding peak value of the normal electrostatic chuck having the same specifications as the electrostatic chuck 4, and determining an abnormality in the capacitance $C_3$ between the positive attracting electrode 8 and the negative attracting electrode 10 of the electrostatic chuck 4.

The first to third steps are described in more detail with reference to FIGS. 3 to 9, which show results of simulations performed by using an equivalent circuit of the apparatus illustrated in FIG. 1, and Table 2, in which the details of determinations are summarized.

TABLE 2

Figure 4:
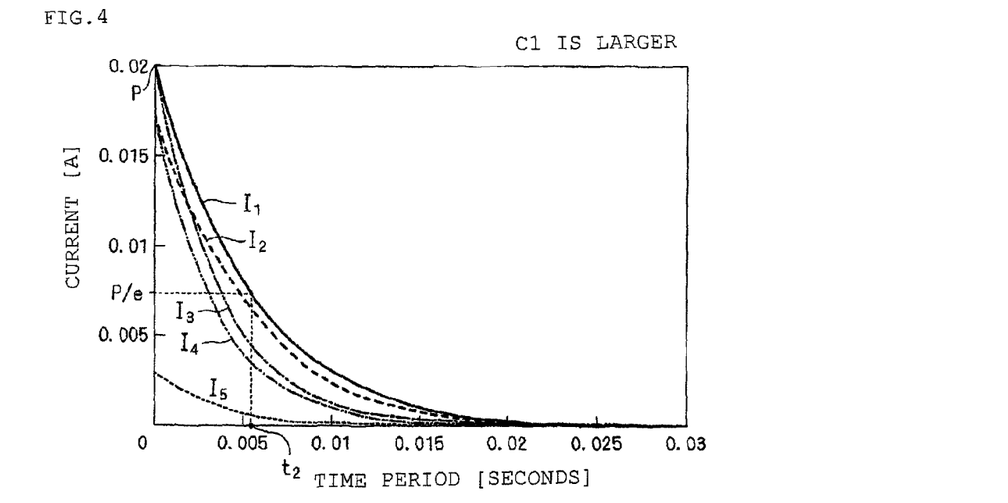
FIG. 4 is a graph showing an example of results of simulation performed with regard to respective transient currents obtained when a capacitance $C_1$ between a positive attracting electrode and a positive auxiliary electrode of the electrostatic chuck is larger compared to a normal condition.
Figure 5:
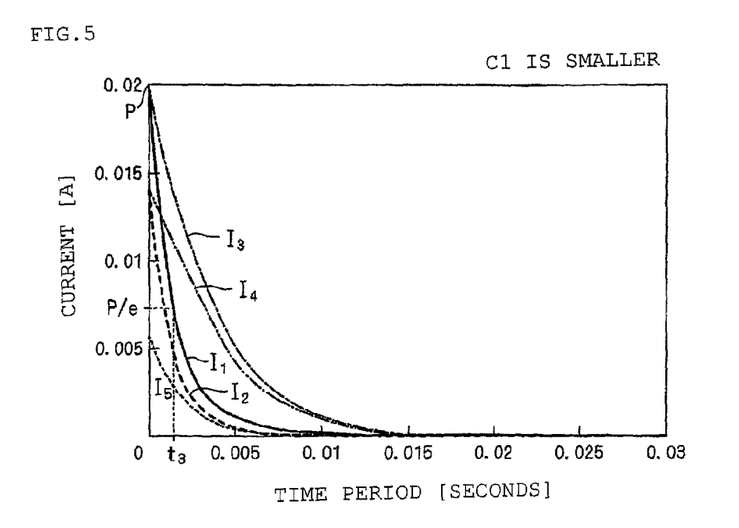
FIG. 5 is a graph showing an example of results of simulation performed with regard to respective transient currents obtained when the capacitance $C_1$ between the positive attracting electrode and the positive auxiliary electrode of the electrostatic chuck is smaller compared to the normal condition.
Figure 6:
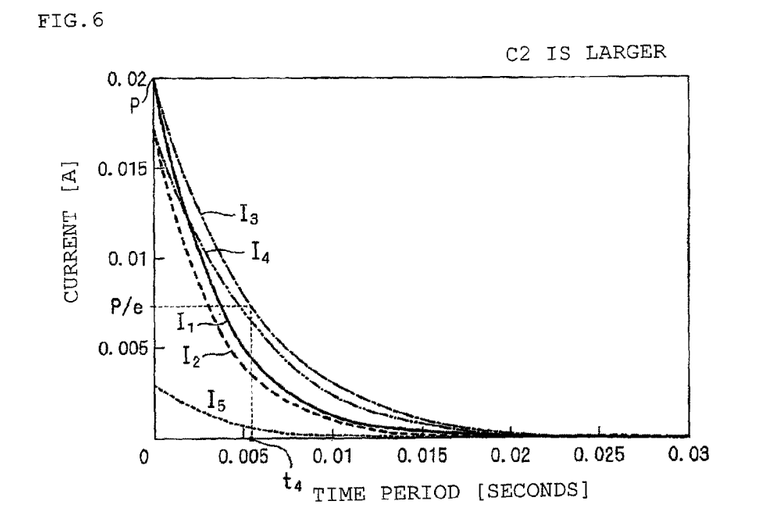
FIG. 6 is a graph showing an example of results of simulation performed with regard to respective transient currents obtained when a capacitance $C_2$ between a negative attracting electrode and a negative auxiliary electrode of the electrostatic chuck is larger compared to a normal condition.
Figure 7:
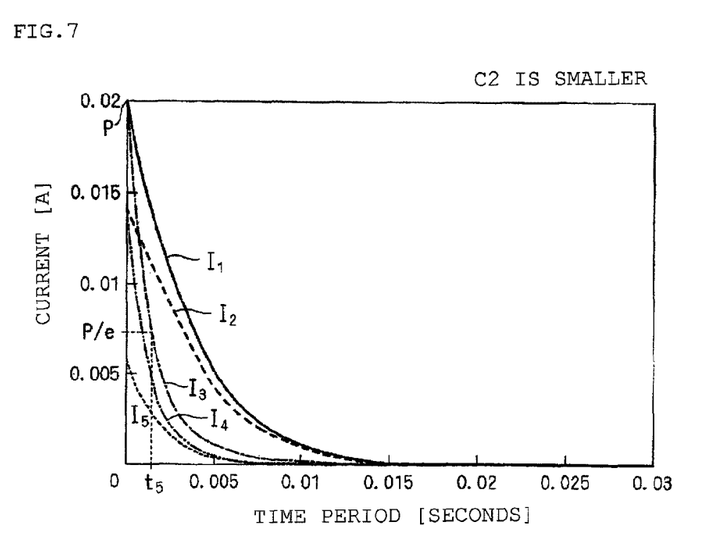
FIG. 7 is a graph showing an example of results of simulation performed with regard to respective transient currents obtained when the capacitance $C_2$ between the negative attracting electrode and the negative auxiliary electrode of the electrostatic chuck is smaller compared to the normal condition.
Figure 8:
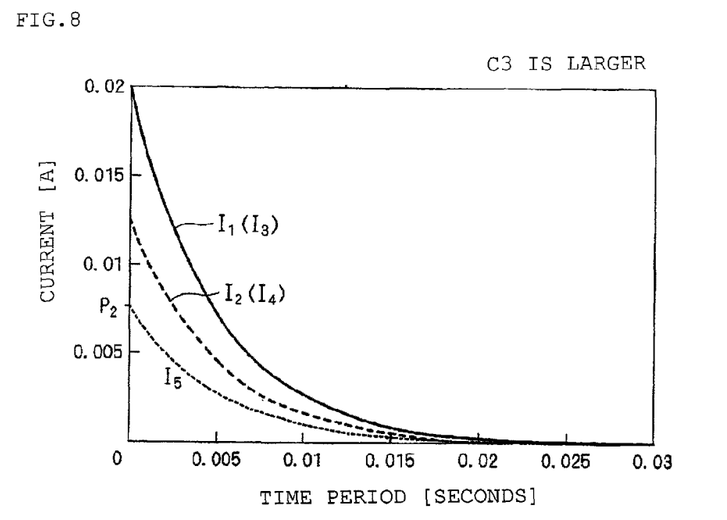
FIG. 8 is a graph showing an example of results of simulation performed with regard to respective transient currents obtained when a capacitance $C_3$ between the positive attracting electrode and the negative attracting electrode of the electrostatic chuck is larger compared to a normal condition.
Figure 9:
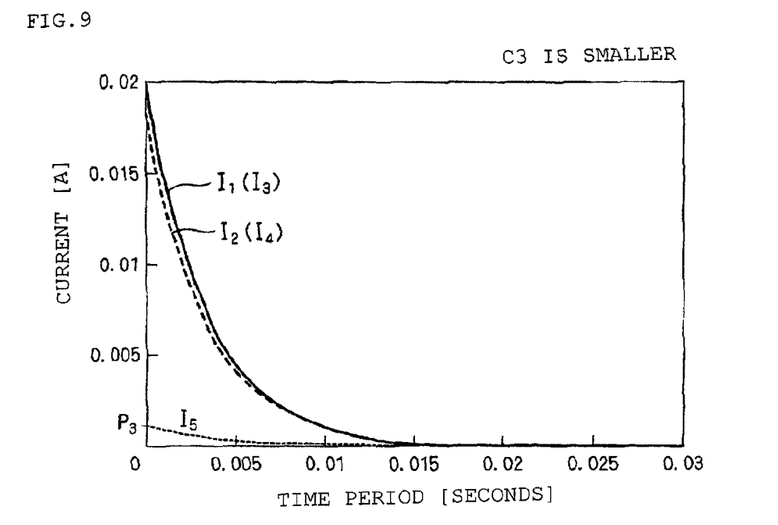
FIG. 9 is a graph showing an example of results of simulation performed with regard to respective transient currents obtained when the capacitance $C_3$ between the positive attracting electrode and the negative attracting electrode of the electrostatic chuck is smaller compared to the normal condition.

| Capacitance of determination target | Measured current | Example of determination result | Detail of abnormality | Simulation result |
|---|---|---|---|---|
| $C_1$ | $I_1$ or $I_2$ | Time period taken for current to be decreased to 1/e of peak value is long | $C_1$ is large | FIG. 4 |
| | | Time period taken for current to be decreased to 1/e of peak value is short | $C_1$ is small | FIG. 5 |
| $C_2$ | $I_3$ or $I_4$ | Time period taken for current to be decreased to 1/e of peak value is long | $C_2$ is large | FIG. 6 |
| | | Time period taken for current to be decreased to 1/e of peak value is short | $C_2$ is small | FIG. 7 |
| $C_3$ | $I_5$ | Peak value is large | $C_3$ is large | FIG. 8 |
| | | Peak value is small | $C_3$ is small | FIG. 9 |

Figure 3:
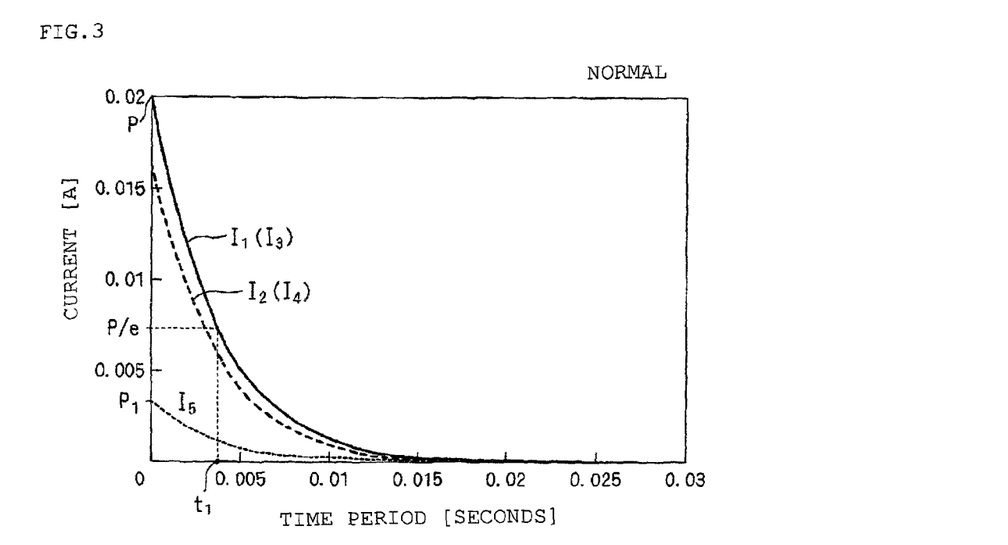
FIG. 3 is a graph showing an example of results of simulation performed with regard to respective transient currents of a normal electrostatic chuck.

FIG. 3 shows an example of the transient currents $I_1$ to $I_5$ of a normal electrostatic chuck 4. The power supply is turned on at a time point when a time period is 0. The same applies to the other figures. The transient current $I_3$ is expressed in parentheses because the curve thereof coincides with that of the transient current $I_1$. The same applies to the transient current $I_4$. The same applies to the other figures.

A time period $t_1$ taken for the transient currents $I_1$ and $I_3$ of the normal electrostatic chuck 4 to become 1/e of a peak value P thereof is measured in advance, and is then set as a reference value for the comparison performed in the first and second steps. The time period $t_1$ may be stored in, for example, the determination apparatus 42. Note that, in the following description and drawings, peak values P of the transient currents $I_1$ to $I_4$ are denoted by the same reference symbol P for the sake of simplification, but the transient currents $I_1$ to $I_4$ do not necessarily have the same value.

In addition, a peak value $P_1$ of the transient current $I_5$ of the normal electrostatic chuck 4 is calculated in advance, and is then set as a reference value for the comparison performed in the third step. The peak value $P_1$ may be stored in, for example, the determination apparatus 42.

Note that, in this simulation, pieces of data on the currents of the normal electrostatic chuck 4 shown in FIG. 3 are used as the reference for the comparison, but, in an actual inspection of the electrostatic chuck 4, there are used pieces of data on currents of a normal electrostatic chuck having the same specifications as an electrostatic chuck 4 to be inspected. The pieces of data of both cases are considered essentially the same, and hence no discrimination therebetween is made in the following description.

FIG. 4 shows an example of a case where there is an abnormality in the capacitance $C_1$ of the electrostatic chuck 4, for example, a case where the capacitance $C_1$ is larger (for example, 150 nF) compared to a normal condition (for example, 100 nF). FIG. 5 shows an example of a case where the capacitance $C_1$ is smaller (for example, 30 nF) compared to the normal condition. As can be seen from comparison to FIG. 3, there are conspicuous changes in the transient currents $I_1$ and $I_2$.

As the first step, time periods $t_2$ (in FIG. 4) and $t_3$ (in FIG. 5) taken for the transient current $I_1$ to be decreased to 1/e of its peak value P are measured, and then compared to the time period $t_1$ of the normal electrostatic chuck 4. In the example of FIG. 4, $t_1 < t_2$ is established, and hence it is determined that the capacitance $C_1$ is larger compared to the normal condition. In the example of FIG. 5, $t_1 > t_3$ is established, and hence it is determined that the capacitance $C_1$ is smaller compared to the normal condition. This is due to the following reason, as is well known in the transient phenomenon. That is, when the capacitance is large, the transient current which flows immediately after the direct current power supply is turned on for the capacitance is gradually decreased with a lapse of time because a charging time period therefor becomes longer, whereas when the capacitance is small, the transient current is sharply decreased with a lapse of time because the charging time period therefor becomes shorter. In this way, it is possible to determine that there is an abnormality in the capacitance $C_1$.

Examples of causes for an increase in the capacitance $C_1$ include a case where the distance between the positive attracting electrode 8 and the positive auxiliary electrode 12 has become smaller in terms of the equivalent circuit. For example, this is conceivably caused when the dielectric body 6 is heat-contracted, when a material of the positive attracting electrode 8 is spread to its vicinity by electromigration, or when, due to electric discharge which occurs in the vicinity of the positive attracting electrode 8, an electrode material is melted into the vicinity and then solidified.

Examples of causes for a decrease in the capacitance $C_1$ include a case where a wire to the positive attracting electrode 8 has been broken, and a case where the distance between the positive attracting electrode 8 and the positive auxiliary electrode 12 has become larger in terms of the equivalent circuit. For example, the latter case is conceivably caused when the dielectric body 6 is expanded by heat, or when the dielectric body 6 is exfoliated on the periphery of the positive attracting electrode 8.

FIG. 6 shows an example of a case where there is an abnormality in the capacitance $C_2$ of the electrostatic chuck 4, for example, a case where the capacitance $C_2$ is larger (for example, 150 nF) compared to the normal condition (for example, 100 nF). FIG. 7 shows an example of a case where the capacitance $C_2$ is smaller (for example, 30 nF) compared to the normal condition. As can be seen from comparison to FIG. 3, there are conspicuous changes in the transient currents $I_3$ and $I_4$.

As the second step, time periods $t_4$ (in FIG. 6) and $t_5$ (in FIG. 7) taken for the transient current $I_3$ to be decreased to 1/e of its peak value P are measured, and then compared to the time period $t_1$ of the normal electrostatic chuck 4. In the example of FIG. 6, $t_1 < t_4$ is established, and hence it is determined that the capacitance $C_2$ is larger compared to the normal condition. In the example of FIG. 7, $t_1 > t_5$ is established, and hence it is determined that the capacitance $C_2$ is smaller compared to the normal condition. In this way, it is possible to determine that there is an abnormality in the capacitance $C_2$.

Examples of causes for an increase or a decrease in the capacitance $C_2$ are the same as in the case of the capacitance $C_1$.

In this way, owing to the first step and the second step, an abnormality in the capacitance $C_1$ and an abnormality in the capacitance $C_2$ can be determined separately from each other. Therefore, it is possible to easily determine which one of the positive attracting electrode 8 and the negative attracting electrode 10 in the electrostatic chuck 4 has a capacitance abnormality in its vicinity.

FIG. 8 shows an example of a case where there is an abnormality in the capacitance $C_3$ of the electrostatic chuck 4, for example, a case where the capacitance $C_3$ is larger (for example, 30 nF) compared to the normal condition (for example, 10 nF). FIG. 9 shows an example of a case where the capacitance $C_3$ is smaller (for example, 3 nF) compared to the normal condition. As can be seen from comparison to FIG. 3, there are conspicuous changes in the transient current $I_5$.

As the third step, peak values $P_2$ (in FIG. 8) and $P_3$ (in FIG. 9) of the transient current $I_5$ are measured, and then compared to the peak value $P_1$ of the normal electrostatic chuck 4. In the example of FIG. 8, $P_1 < P_2$ is established, and hence it is determined that the capacitance $C_3$ is larger compared to the normal condition. In the example of FIG. 9, $P_1 > P_3$ is established, and hence it is determined that the capacitance $C_3$ is smaller compared to the normal condition. In this way, it is possible to determine that there is an abnormality in the capacitance $C_3$.

Examples of causes for an increase in the capacitance $C_3$ include: (a) a case where the distance between the pair of the attracting electrodes 8 and 10 has become smaller in terms of the equivalent circuit; and (b) a case where the dielectric constant of the dielectric body 6 between the pair of the attracting electrodes 8 and 10 has become larger. For example, the case (a) is conceivably caused when materials of the pair of the attracting electrodes 8 and 10 are spread between the pair of the attracting electrodes 8 and 10 by electromigration, or when, due to electric discharge which occurs between the pair of the attracting electrodes 8 and 10, an electrode material is melted toward the other electrode and then solidified.

Examples of causes for a decrease in the capacitance $C_3$ include a case where both or one of the attracting electrodes 8 and 10 has been partially chipped, and a case where the dielectric constant of the dielectric body 6 has become smaller due to temporal change or the like.

In this way, owing to the third step, it is possible to easily determine that there is a capacitance abnormality between the pair of the attracting electrodes 8 and 10.

Note that, as described above, the auxiliary electrodes 12 and 14 of the electrostatic chuck 4 are preferably set to have the shapes corresponding to the attracting electrodes 8 and 10, respectively. Such configuration enables the capacitances $C_1$ and $C_2$ to become larger, and accordingly, the transient currents $I_2$ and $I_4$ respectively flowing through the capacitances $C_1$ and $C_2$ become larger and change more gradually. Therefore, changes in the transient currents can be determined with more ease, resulting in easier determination of abnormalities in the capacitances $C_1$ and $C_2$.

In this embodiment, as described above, in addition to the operation means for calculating the transient current $I_5$, the determination apparatus 42 also has the functions of performing processing which has substantially the same contents as the determination step (that is, the measurement of the transient currents, and the comparison and the determination of a capacitance abnormality. The same applies to the following). More specifically, in this embodiment, the determination apparatus 42 has a first function of performing processing which has substantially the same content as the first step, a second function of performing processing which has substantially the same content as the second step, and a third function of performing processing which has substantially the same content as the third step. In other words, the determination apparatus 42 includes means having the above-mentioned functions.

Therefore, the electrostatic chuck apparatus of this embodiment, which includes the electrostatic chuck 4, the chuck power supply 26, the ammeters 21 to 24, and the determination apparatus 42, can as well provide the same operation and effect as those described regarding the inspection method.

REFERENCE SIGNS LIST

2 . . . object to be attracted, 4 . . . electrostatic chuck, 6 . . . dielectric body, 8 . . . positive attracting electrode, 10 . . . negative attracting electrode, 12 . . . positive auxiliary electrode, 14 . . . negative auxiliary electrode, 21 to 24 . . . ammeter, 26 . . . chuck power supply, 42 . . . determination apparatus, $I_1$ to $I_5$ . . . current, $C_1$ to $C_3$ . . . capacitance, +V . . . positive direct current voltage, −V . . . negative direct current voltage, GND . . . ground potential portion

The invention claimed is:

1. A method of inspecting an electrostatic chuck, which is used in an electrostatic chuck apparatus comprising:
an electrostatic chuck of bipolar type for attracting an object to be attracted by means of static electricity, comprising, in a dielectric body, a positive attracting electrode and a negative attracting electrode arranged along a surface of the dielectric body;
a chuck power supply for supplying, with a ground potential portion set as a reference, a positive direct current voltage and a negative direct current voltage to the positive attracting electrode and the negative attracting electrode of the electrostatic chuck, respectively; and
a positive auxiliary electrode and a negative auxiliary electrode on a back surface side of the positive attracting electrode and the negative attracting electrode in the dielectric body of the electrostatic chuck, the positive auxiliary electrode and the negative auxiliary electrode being arranged so as to face the positive attracting electrode and the negative attracting electrode, respectively, with a predetermined gap therebetween, and being connected to the ground potential portion,
the method of inspecting an electrostatic chuck comprising a determination step of:
measuring each of at least three of transient currents obtained when, under a state in which the object to be attracted is not mounted on the electrostatic chuck, the positive direct current voltage and the negative direct current voltage are applied to the electrostatic chuck from the chuck power supply or cease to be applied to the electrostatic chuck from the chuck power supply,
the transient currents comprising:
(a) a first transient current flowing between the positive attracting electrode of the electrostatic chuck and the chuck power supply;
(b) a second transient current flowing between the positive auxiliary electrode of the electrostatic chuck and the ground potential portion;
(c) a third transient current flowing between the negative attracting electrode of the electrostatic chuck and the chuck power supply; and
(d) a fourth transient current flowing between the negative auxiliary electrode of the electrostatic chuck and the ground potential portion;
calculating a fifth transient current representing a difference between the first transient current and the second transient current or a difference between the third transient current and the fourth transient current;
comparing obtained transient currents to respective reference values of transient currents obtained from a normal electrostatic chuck; and
determining a capacitance abnormality in a vicinity of each of the positive attracting electrode and the negative attracting electrode of the electrostatic chuck.

2. A method of inspecting an electrostatic chuck according to claim 1, wherein the determination step comprises, when the positive direct current voltage and the negative direct current voltage are applied to the electrostatic chuck from the chuck power supply:
(a) a first step of measuring at least one of the first transient current and the second transient current, comparing a time period taken for the at least one of the first transient current and the second transient current to be decreased to a predetermined proportion to a peak value thereof to a corresponding time period of the normal electrostatic chuck, and determining a capacitance abnormality between the positive attracting electrode and the positive auxiliary electrode of the electrostatic chuck;
(b) a second step of measuring at least one of the third transient current and the fourth transient current, comparing a time period taken for the at least one of the third transient current and the fourth transient current to be decreased to the predetermined proportion to a peak value thereof to a corresponding time period of the normal electrostatic chuck, and determining a capacitance abnormality between the negative attracting electrode and the negative auxiliary electrode of the electrostatic chuck; and
(c) a third step of comparing a peak value of the fifth transient current determined as the difference between the first transient current and the second transient current or as the difference between the third transient current and the fourth transient current, to a corresponding peak value of the normal electrostatic chuck, and determining a capacitance abnormality between the positive attracting electrode and the negative attracting electrode of the electrostatic chuck.

3. A method of inspecting an electrostatic chuck according to claim 1 or 2, wherein the positive auxiliary electrode of the electrostatic chuck has a shape corresponding to the positive attracting electrode, and the negative auxiliary electrode has a shape corresponding to the negative attracting electrode.

4. An electrostatic chuck apparatus, comprising:
an electrostatic chuck of bipolar type for attracting an object to be attracted by means of static electricity, comprising, in a dielectric body, a positive attracting electrode and a negative attracting electrode arranged along a surface of the dielectric body;

a chuck power supply for supplying, with a ground potential portion set as a reference, a positive direct current voltage and a negative direct current voltage to the positive attracting electrode and the negative attracting electrode of the electrostatic chuck, respectively;

a positive auxiliary electrode and a negative auxiliary electrode on a back surface side of the positive attracting electrode and the negative attracting electrode in the dielectric body of the electrostatic chuck, the positive auxiliary electrode and the negative auxiliary electrode being arranged so as to face the positive attracting electrode and the negative attracting electrode, respectively, with a predetermined gap therebetween;

a first ammeter connected between the positive attracting electrode of the electrostatic chuck and the chuck power supply, for measuring a first transient current flowing therebetween;

a second ammeter connected between the positive auxiliary electrode of the electrostatic chuck and the ground potential portion, for measuring a second transient current flowing therebetween;

a third ammeter connected between the negative attracting electrode of the electrostatic chuck and the chuck power supply, for measuring a third transient current flowing therebetween;

a fourth ammeter connected between the negative auxiliary electrode of the electrostatic chuck and the ground potential portion, for measuring a fourth transient current flowing therebetween;

operation means for calculating a fifth transient current determined as a difference between the first transient current and the second transient current or as a difference between the third transient current and the fourth transient current; and a determination apparatus including a function of:
measuring at least three of the first transient current, the second transient current, the third transient current, and the fourth transient current, which are measured by at least three of the first ammeter, the second ammeter, the third ammeter, and the fourth ammeter when, under a state in which the object to be attracted is not mounted on the electrostatic chuck, the positive direct current voltage and the negative direct current voltage are applied to the electrostatic chuck from the chuck power supply or cease to be applied to the electrostatic chuck from the chuck power supply;

calculating the fifth transient current, which is calculated by the operation means;

comparing obtained transient currents to respective reference values of transient currents obtained from a normal electrostatic chuck; and determining a capacitance abnormality in the electrostatic chuck.

5. An electrostatic chuck apparatus according to claim 4, wherein the determination apparatus includes, when the positive direct current voltage and the negative direct current voltage are applied to the electrostatic chuck from the chuck power supply:

(a) a first function of measuring at least one of the first transient current and the second transient current, comparing a time period taken for the at least one of the first transient current and the second transient current to be decreased to a predetermined proportion to a peak value thereof to a corresponding time period of the normal electrostatic chuck, and determining a capacitance abnormality between the positive attracting electrode and the positive auxiliary electrode of the electrostatic chuck;

(b) a second function of measuring at least one of the third transient current and the fourth transient current, comparing a time period taken for the at least one of the third transient current and the fourth transient current to be decreased to the predetermined proportion to a peak value thereof to a corresponding time period of the normal electrostatic chuck, and determining a capacitance abnormality between the negative attracting electrode and the negative auxiliary electrode of the electrostatic chuck; and (c) a third function of comparing a peak value of the fifth transient current determined as the difference between the first transient current and the second transient current or as the difference between the third transient current and the fourth transient current, to a corresponding peak value of the normal electrostatic chuck, and determining a capacitance abnormality between the positive attracting electrode and the negative attracting electrode of the electrostatic chuck.

6. An electrostatic chuck apparatus according to claim 4 or 5, wherein the positive auxiliary electrode of the electrostatic chuck has a shape corresponding to the positive attracting electrode, and the negative auxiliary electrode has a shape corresponding to the negative attracting electrode.

* * * * *